(12) United States Patent
Kuratomi

(10) Patent No.: US 9,851,628 B2
(45) Date of Patent: Dec. 26, 2017

(54) LIGHT SOURCE CONTROL APPARATUS, IMAGE PROJECTION APPARATUS AND STORAGE MEDIUM STORING LIGHT SOURCE CONTROL PROGRAM

(71) Applicant: CANON KABUSHIKI KAISHA, Tokyo (JP)

(72) Inventor: Kazuyuki Kuratomi, Sakura (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 7 days.

(21) Appl. No.: 14/962,381

(22) Filed: Dec. 8, 2015

(65) Prior Publication Data
US 2016/0164256 A1    Jun. 9, 2016

(30) Foreign Application Priority Data
Dec. 9, 2014  (JP) .................................. 2014-248571

(51) Int. Cl.
*G03B 21/20* (2006.01)
*H01S 5/068* (2006.01)
(Continued)

(52) U.S. Cl.
CPC ....... *G03B 21/206* (2013.01); *G03B 21/2033* (2013.01); *G03B 21/2053* (2013.01);
(Continued)

(58) Field of Classification Search
CPC .............. G03B 21/2053; G03B 21/206; G03B 21/2033; H01S 5/06804; H01S 5/06825;
(Continued)

(56) References Cited

U.S. PATENT DOCUMENTS

2014/0232996 A1* 8/2014 Okamoto .............. G02B 27/48
                                                      353/85
2016/0018724 A1* 1/2016 Okamura ........... G03B 21/2013
                                                      353/85

FOREIGN PATENT DOCUMENTS

CN    101957542 A    1/2011
CN    102196219 A    9/2011
(Continued)

OTHER PUBLICATIONS

Office Action issued in Chinese Appln. No. 201510897909.6 dated Oct. 23, 2017. English translation provided.

*Primary Examiner* — Sultan Chowdhury
*Assistant Examiner* — Magda Cruz
(74) *Attorney, Agent, or Firm* — Rossi, Kimms & McDowell LLP

(57) ABSTRACT

The light source control apparatus controls drive of multiple light sources included in a light source unit to be used in a state where the multiple light sources are lit. The multiple light sources each include multiple light-emitting elements. The light source control apparatus includes an acquirer acquiring temporal information relating to a temporal change of each of the light sources, an estimator acquiring an estimated lifetime of each of the multiple light sources by using the temporal information, and a controller decreasing, when the multiple light sources include a first light source whose estimated lifetime is shorter than a target lifetime set for the light source unit, a light emission amount of the first light source.

11 Claims, 8 Drawing Sheets

(51) Int. Cl.
  *H01S 5/0683* (2006.01)
  *H01S 5/00* (2006.01)
  *H01S 5/40* (2006.01)

(52) U.S. Cl.
  CPC ...... *H01S 5/06804* (2013.01); *H01S 5/06825* (2013.01); *H01S 5/0021* (2013.01); *H01S 5/0683* (2013.01); *H01S 5/06808* (2013.01); *H01S 5/4018* (2013.01)

(58) Field of Classification Search
  CPC .. H01S 5/0021; H01S 5/06808; H01S 5/0683; H01S 5/4018
  See application file for complete search history.

(56) References Cited

FOREIGN PATENT DOCUMENTS

| | | |
|---|---|---|
| CN | 102890394 A | 1/2013 |
| CN | 103412454 A | 11/2013 |
| EP | 0978756 A1 | 2/2000 |
| JP | 2010169754 A | 8/2010 |

\* cited by examiner

LIGHT SOURCE CONTROL APPARATUS, IMAGE PROJECTION APPARATUS AND STORAGE MEDIUM STORING LIGHT SOURCE CONTROL PROGRAM

BACKGROUND OF THE INVENTION

Field of the Invention

The present invention relates to a light source control apparatus, such as an image projection apparatus (projector), which uses a light source unit and controls light emissions of multiple light sources included in the light source unit.

Description of the Related Art

Projectors using a light source unit provided with multiple solid light sources, such as light-emitting diodes (LED) and laser diodes (LD), have characteristics including, in comparison to discharge lamps, a higher-luminance output within a shorter period of time, a wider color range and a longer lifetime.

On the other hand, since the solid light sources are semiconductor devices, their luminance decreases at a higher rate of speed when continuously used under high temperature deteriorate. This characteristic makes it necessary for the solid light sources to be always used under a lower temperature compared to the discharge lamps.

Japanese Patent Laid-Open No. 2010-169754 discloses a projector that measures light emission amounts of the solid light sources and performs heat dissipation of the solid light sources when it determines, depending on the measured light emission amount, that the solid light sources have deteriorated, thereby reducing temperature rise of the solid light sources.

Since the solid light sources such as the LEDs and the LDs each have a light emission amount less compared to those of the discharge lamps, many projectors, which require a large light amount, use the light source unit including multiple solid light sources, with all of the multiple light sources being lit.

However, the individual solid light sources have a variation in the lifetime thereamong. This variation in the lifetime causes one of the multiple solid light sources in the light source unit to deteriorate at a higher rate of speed compared to those of the other solid light sources, which may prevent the light source unit from satisfying a required lifetime condition (for example, ten thousand hours immediately prior to a decrease from an initial luminance to 50% thereof). The projector disclosed in Japanese Patent Laid-Open No. 2010-169754 is not intended for lifetime control of the light source unit including such multiple light sources.

SUMMARY OF THE INVENTION

The present invention provides a light source control apparatus capable of reducing an influence of a variation in lifetime among individual light sources included in a light source unit. The present invention further provides an image projection apparatus using the light source control apparatus.

The present invention provides as an aspect thereof a light source control apparatus configured to control drive of multiple light sources included in a light source unit to be used in a state where the multiple light sources are lit. The multiple light sources each include multiple light-emitting elements. The light source control apparatus includes an acquirer configured to acquire temporal information relating to a temporal change of each of the light sources, an estimator configured to acquire an estimated lifetime of each of the multiple light sources by using the temporal information, and a controller configured to decrease, when the multiple light sources include a first light source whose estimated lifetime is shorter than a target lifetime set for the light source unit, a light emission amount of the first light source.

The present invention provides as another aspect thereof an image projection apparatus including the above light source control apparatus, and an optical unit configured to project an image formed by modulating, depending on an input image signal, light from a light source unit including multiple light sources whose light emissions are controlled by the light source control apparatus.

The present invention provides as still another aspect thereof a non-transitory computer-readable storage medium storing a computer program to cause a computer to control drive of multiple light sources included in a light source unit to be used in a state where the multiple light sources are lit. The multiple light sources each including multiple light-emitting elements. The computer program causing the computer to acquire temporal information relating to a temporal change of each of the light sources, to acquire an estimated lifetime of each of the multiple light sources by using the temporal information, and to decrease, when the multiple light sources include a first light source whose estimated lifetime is shorter than a target lifetime set for the light source unit, a light emission amount of the first light source.

Further features and aspects of the present invention will become apparent from the following description of exemplary embodiments with reference to the attached drawings.

DESCRIPTION OF THE EMBODIMENTS

Exemplary embodiments of the present invention will be described below with reference to the attached drawings.

Embodiment 1

Figure 1:
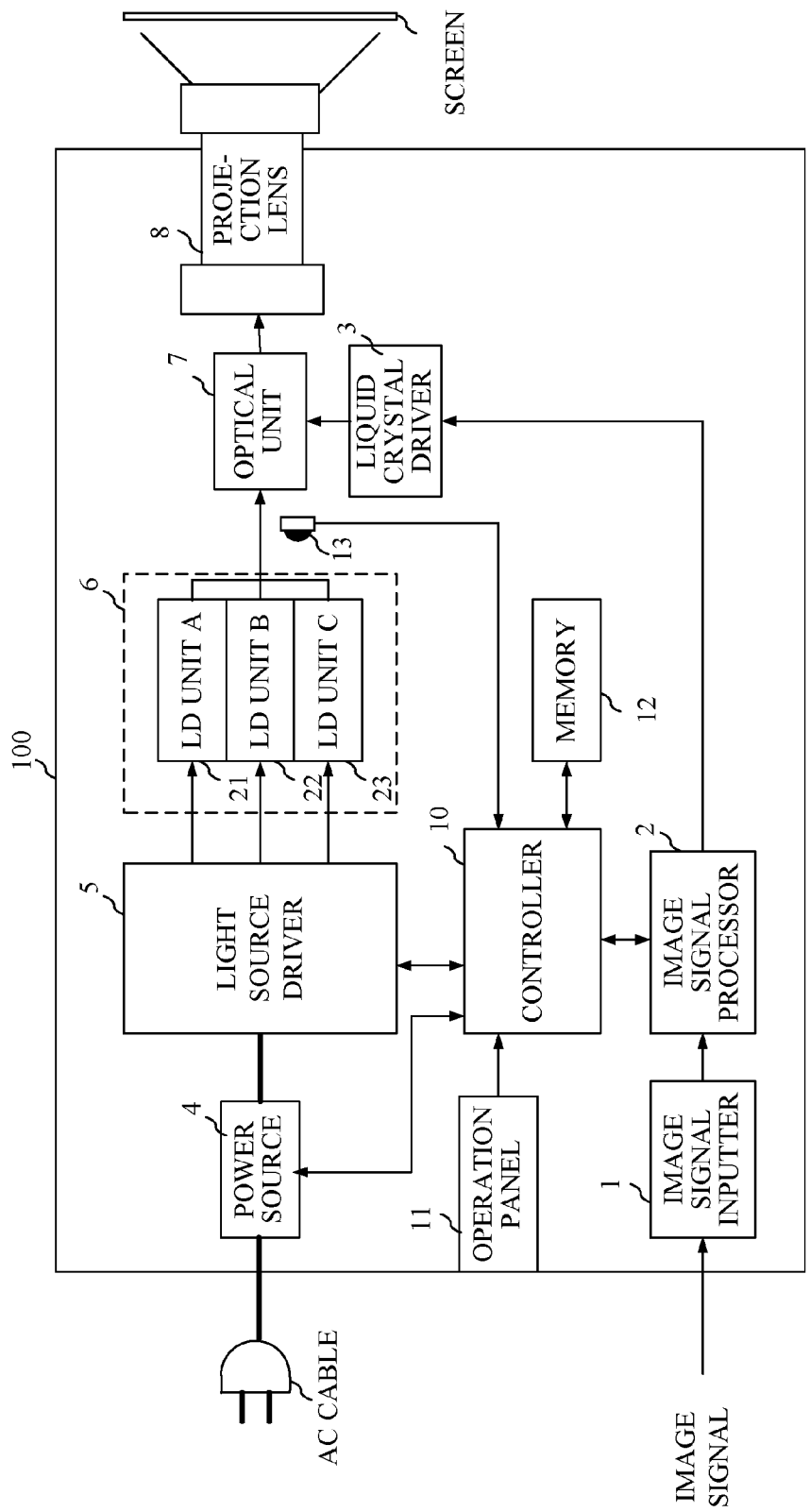
FIG. 1 is a block diagram illustrating a configuration of a projector provided with a light source control apparatus that is Embodiment 1 of the present invention.

FIG. 1 illustrates a configuration of a projector (image projection apparatus) 100 provided with a light source control apparatus that is a first embodiment (Embodiment 1) of the present invention. An image signal given from an external device such as a computer is input to an image signal inputter 1. The image signal inputter 1 includes an AD converter that converts, into a digital image signal, the input image signal that is an analog signal such as a VGA signal and a Video signal. The image signal inputter 1 further includes a receiver that converts, into a predetermined digital signal format, the input image signal that is a digital image signal such as a HDMI signal and a DVI signal. The digital image signal is output from the image signal inputter 1 and then sent to an image signal processor 2.

The image signal processor 2 is constituted by, for example, a digital signal processor (DSP) intended for image signal processing. The image signal processor 2 performs a scaling process that reads a resolution of the input image signal to convert the input image signal into one having a resolution required for a process therein, a menu display process in response to a menu display operation by a user, a keystone correction process for causing a projected image to be displayed in a rectangular shape when the projected image obliquely projected, and the like.

The digital signal converted by the image signal processor 2 into the predetermined format is sent to a liquid crystal driver 3 and then converted into a liquid crystal drive signal for driving liquid crystal panels ((not illustrated)) as light-emitting elements included in an optical unit 7. Instead of the liquid crystal panel, a light-emitting element such as a digital micromirror device (DMD) may be used.

A power source 4 converts an AC power source input from outside into a DC power source and supplies the DC power source having a predetermined voltage to a light source driver 5 and other component parts included in the projector 100.

The light source driver 5 is a drive circuit for lighting multiple light sources (described later) included in the light source unit 6. The light source driver 5 is constituted by a power source circuit such as a DC-to-DC converter. The light source driver 5 performs light emission drive of the light source unit depending on a drive condition from a controller 10.

Figure 2:
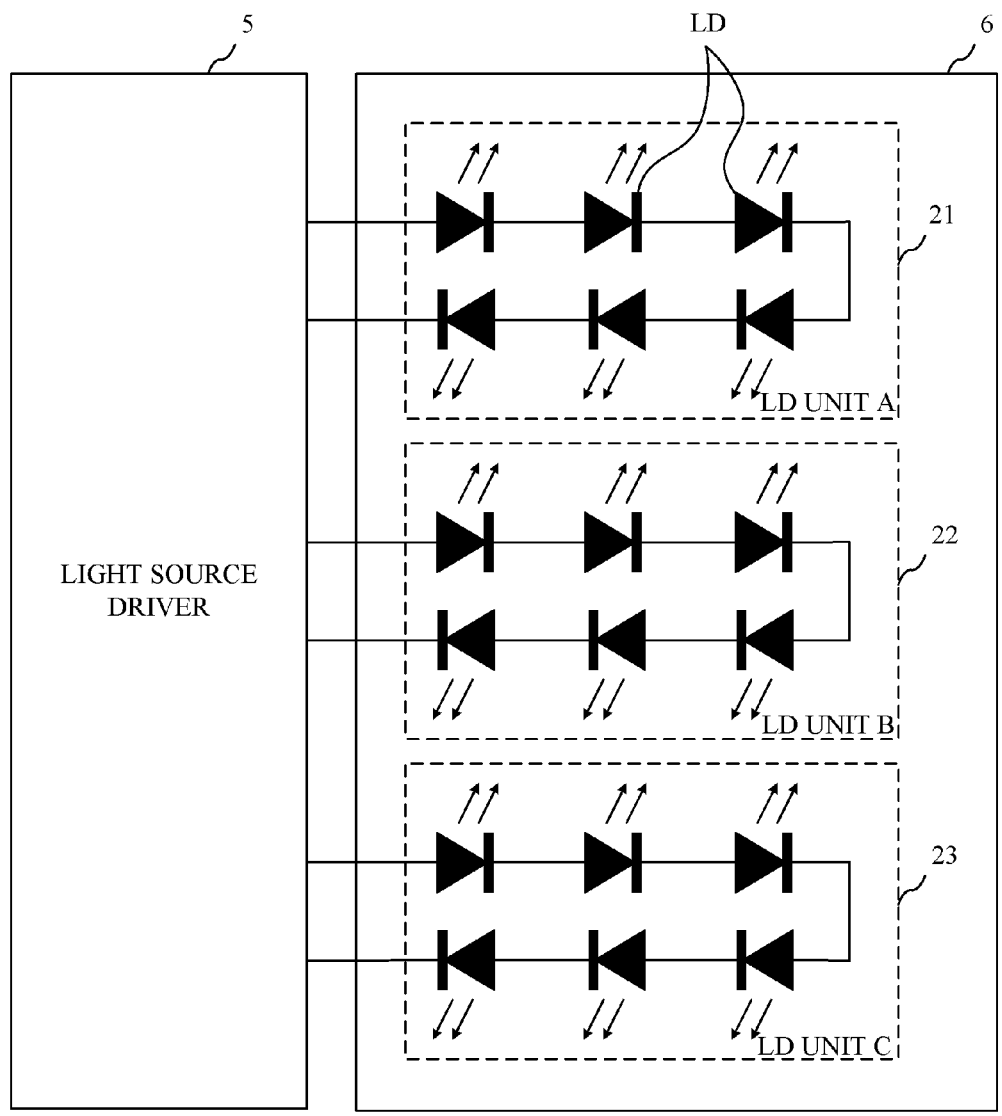
FIG. 2 illustrates a configuration of a light source unit included in the projector of Embodiment 1.

As illustrated in detail in FIG. 2, the light source unit 6 includes an LD unit A (21), an LD unit B (22) and an LD unit C (23) as multiple (in this embodiment, three) light sources. Each of the LD units 21 to 23 corresponds to a single light source. Each of the LD units 21 to 23 is constituted by semiconductor laser diodes (each hereinafter referred to as "an LD") that are multiple light-emitting elements. In each of the LD units 21 to 23, the multiple LDs are connected in series with one another. Each of the three LD units 21 to 23 can be independently lit and driven. In an initial state (at a start-up of the projector 100 for an inspectional purpose in a manufacturing plant or at a first start-up of the projector 100 by the user), the three LD units 21 to 23 provide mutually identical light emission amounts in response to application of mutually identical drive current values thereto. The expression "mutually identical light emission amounts" referred to herein means light emission amounts that can be regarded as mutually identical within a permissible range.

As described above, constituting the light source unit 6 by the multiple LD units 21 to 23 enables driving the LD units 21 to 23 at mutually different drive current values and performing intermittent drive (PWM drive) of the LD units 21 to 23 at mutually different duty ratios. This enables independently adjusting the light emission amounts, namely, drive loads of the respective LD units 21 to 23.

The optical unit 7 is constituted by a phosphor, an illumination optical system, the above-described liquid crystal panels, a color separation/combination optical system and others. Since light from the light source unit 6 is a single-color light, projecting part of the light onto the phosphor to excite the phosphor generates other color lights to produce a white light. The white light is uniformed by optical elements such as a fly-eye lens and a condenser lens of the illumination optical system and then separated by the color separation/combination optical system into three color lights, namely, an red (R) light, a green (G) light and a blue (B) light. The three color lights are projected onto transmissive or reflective liquid crystal panels respectively corresponding to the three color lights. A transmittance or a reflectance of each of the liquid crystal panel is controlled in response to drive of the liquid crystal panels by the liquid crystal driver 3. Consequently, the lights entering the liquid crystal panels are modulated depending on the above-described input image signals, forming color images. The three modulated color lights are combined by the color separation/combination optical system, enter a projection lens 8 and are then projected by the projection lens 8 onto a projection surface such as a screen. Consequently, a color image is projected onto (displayed on) the projection surface.

Although this embodiment generates, by using the phosphor, the other color lights from the single-color light emitted by the LD, LDs that emit the other color lights may be separately provided. The light source unit 6 may be constituted by LEDs as the light-emitting elements instead of the LDs.

The controller 10 is constituted by a microcomputer including a CPU and others. The controller 10 controls the entire projector 100. For instance, the controller 10 performs a turning on/off control of the light source unit 6 by outputting a turning on/off control signal to the light source driver 5, controls power supply from the power source 4 to the respective component parts and performs turning off of the light source unit 6 when a temperature in the projector 100 increases to an abnormal level. In addition, the controller 10 performs, on the light source unit 6, a light source control process described later. In this operation, the controller 10 corresponds to the light source control apparatus and specifically serves as an acquirer, an estimator and a controller. The light source control apparatus may include a measurer such as a light amount sensor 13 described later.

A memory 12 connected to the controller 10 holds (stores) various setting data of the projector 100. In addition, the memory 12 records measurement data on the light emission amount of the light source unit 6 and measurement data of a light amount of the projected image displayed on the projection surface.

An operation panel 11 is constituted by a start-up button that allows a user to instruct turning on/off of the power source of the projector 100, a setting button that allows the user to perform various settings, a display that informs the user of a state of the projector 100, and others. Upon detection of pressing of any one of the buttons on the operation panel 11, the controller 10 determines the button being pressed by the user and then performs a control corresponding to the pressed button. An infrared light-receiving sensor may be provided instead of or in combination with the operation panel 11 to perform various operations of the projector 100 via an operation of an infrared remote controller.

The light amount sensor 13 as the measurer is placed in the projector 100 in order to measure the light emission amounts of the respective LD units (light sources) 21 to 23 included in the light source unit 6 and is connected to the controller 10. The light emission amount of the LD unit is included in temporal information relating to a temporal change (change over time) of the LD unit as the light source. The light emission amount is also a physical amount as a measurable amount. The data on the light emission amounts that is a result of the measurement by the light amount sensor 13 is held in the memory 12 as described above. In the initial state, the LD units 21 to 23 are sequentially lit one by one in order to measure, by the light amount sensor 13, the data on the light emission amount of each of the LD units 21 to 23. The light emission amount of each of the LD units 21 to 23 measured in this measurement (hereinafter respectively referred to as "an initial individual light emission amount") is also held in the memory 12. The measurement of the initial individual light emission amount may be automatically performed by the controller 10 in response to the start-up of the projector 100, similarly to light emission amount measurement performed on the LD units 21 to 23 in order to estimate lifetimes of the LD units 21 to 23 in a light amount control process described later. When the lifetimes are estimated multiple times, the data on the results of the measurement of the light emission amounts of the LD units 21 to 23 is recorded in the memory 12 each time the estimation is performed.

Next, description will be made of the light source control process performed in the projector 100 of this embodiment with reference to a flowchart of FIG. 3. This process is executed by the controller 10 according to a light source control program that is a computer program.

At step S101, in response to an operation of the start-up button on the operation panel 11 by the user, the controller 10 determines whether or not to perform a lifetime estimation process (hereinafter simply referred to as "lifetime estimation") for the light source unit 6. Since the light emission amount of the LD as a solid light source gradually decreases due to its temporal change (temporal deterioration), the controller 10 performs the lifetime estimation at a time when the projector 100 has been used for a predetermined period of time from the initial state. For this reason, the controller 10 records a cumulative lighting time of the light source unit 6 from the initial state, and then, upon the cumulative lighting time reaching the predetermined period of time, determines to perform the lifetime estimation. Thereafter, the controller 10 proceeds to step S102. On the other hand, when the cumulative lighting time has not reached the predetermined period of time, the controller 10 proceeds to step S109. The lifetime estimation may be performed each time the projector 100 is started up.

At step S102, the controller 10 reads the data on the initial individual light emission amounts of the respective LD units 21 to 23 from the memory 12. In addition, the controller 10 reads, from the memory 12, a drive duty ratio currently set (for example, initially set) as a duty ratio to light the LD units 21 to 23. The drive duty ratio is a ratio of a lighting time to one intermittent drive period in the intermittent drive of the LD units 21 to 23. The solid light source can be switched between its lit state and its unlit state at high speed. Changing a ratio between the lighting time and the unlighting time in the one intermittent drive enables controlling the light emission amount. In this embodiment, the drive duty ratio of each of the LD units in the initial state is set to 80% (that is, the lighting time accounts for 80% and the unlighting time accounts for 20%).

Even when the controller 10 proceeds from step S101 to step S109, the controller 10 reads, as at step S102, the drive duty ratio (in this embodiment, 80%) used to light the LD units and then proceeds to step S110.

Figure 4:
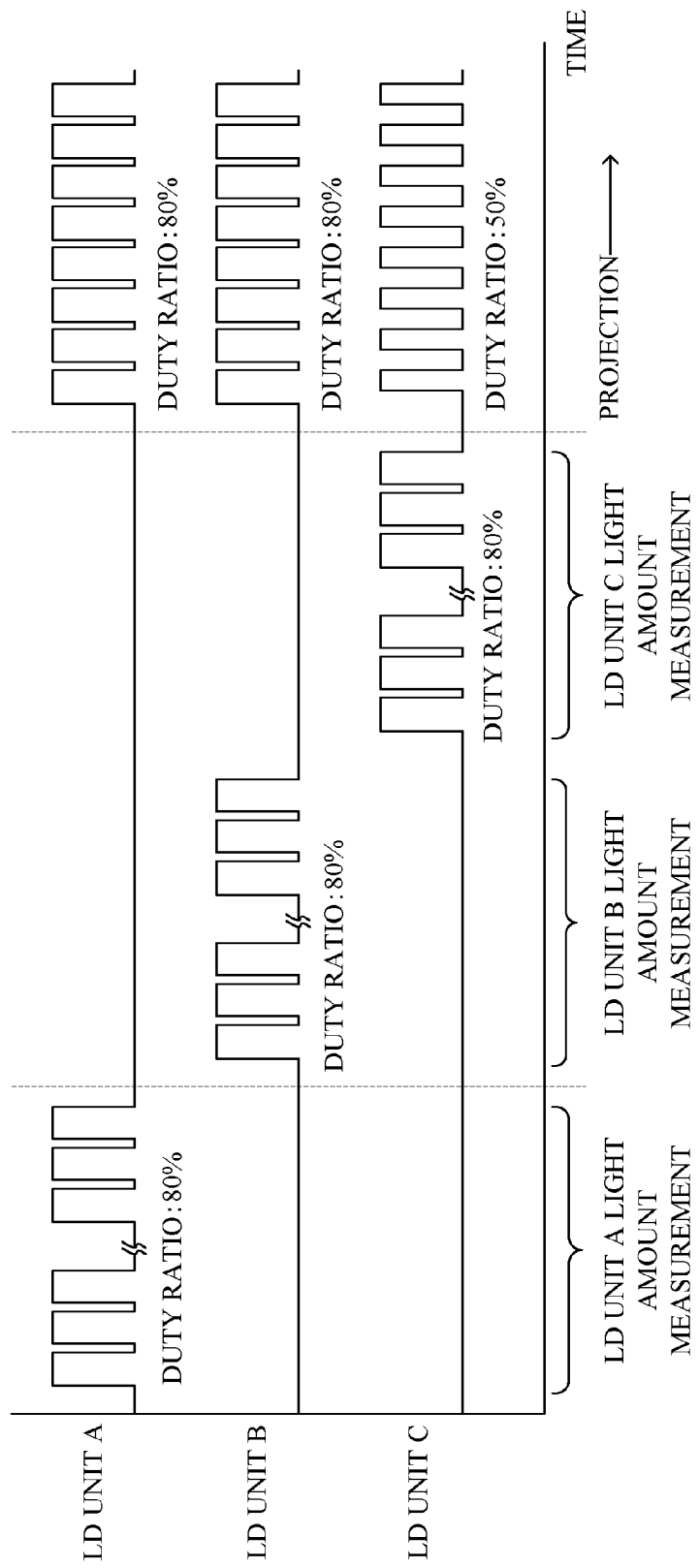
FIG. 4 illustrates an example of the light source control process in the projector of Embodiment 1.

Next, at steps S103 to S105, the controller 10 drives the light amount sensor 13 and causes the light amount sensor 13 to measure a current light emission amount (hereinafter respectively referred to as "a current individual light emission amount") of each of the LD units 21 to 23. At these steps, as illustrated in FIG. 4, the controller 10 causes the light amount sensor 13 to measure the current individual light emission amount of each LD unit while sequentially driving the LD units A(21), B(22) and C(23) in this order at the drive duty ratio of 80%, that is, sequentially changing the LD unit to be lit. This is because only one light amount sensor 13 is provided in this embodiment. In order to prevent lights emitted from other LD units than one measurement object LD unit from affecting the measurement of the light emission amount of the measurement object LD unit, the other LD units are turned off during the measurement. In order to simultaneously measure the current individual light emission amounts of the LD units 21 to 23, multiple light amount sensor may be provided. The current individual light emission amounts of the LD units may be measured in a different order from the above-described order.

Upon completion of the measurement of the current individual light emission amounts of the three LD units 21 to 23, the controller 10 performs, at step S106, the lifetime estimation by using results of the measurement of the current individual light emission amounts of the LD units 21 to 23.

Figure 5:
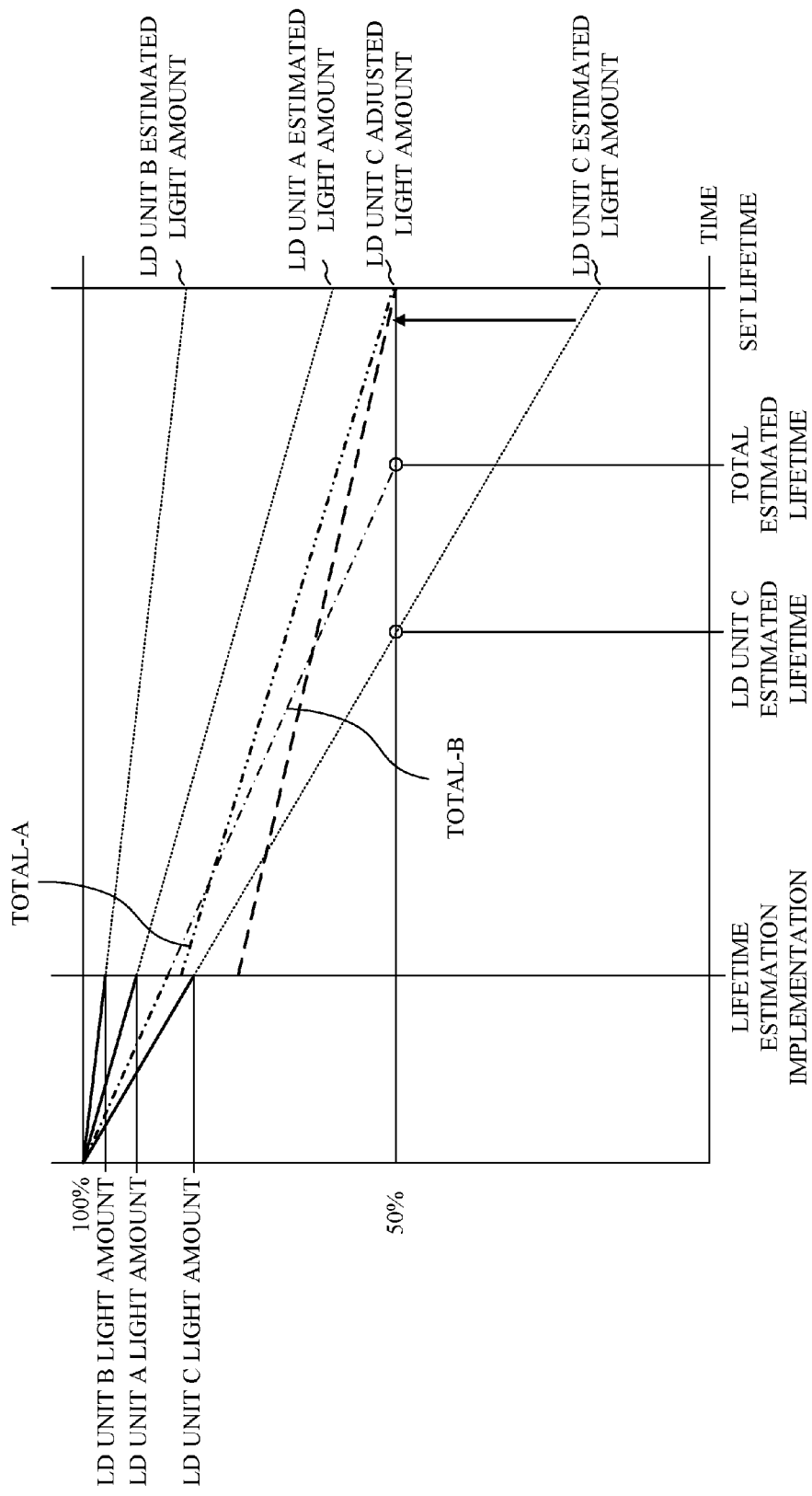
FIG. 5 illustrates lifetimes of the light source unit and individual light sources in the projector of Embodiment 1.

FIG. 5 illustrates results of the lifetime estimation for the LD units A (21), B (22) and C (23) and an example of lifetime control performed at step S108 in this embodiment. A horizontal axis indicates a use time of the projector 100, namely, the cumulative lighting time of each LD unit, and a vertical axis indicates the light emission amount (simply written as "LIGHT AMOUNT" in the drawing). The controller 10 calculates, from the initial individual light emission amount of the LD unit and the current individual light emission amounts thereof acquired by the above-described measurement, a decreasing slope of the light emission amount with respect to the cumulative lighting time up to a current time (written as "LIFETIME ESTIMATION IMPLEMENTATION" in the drawing). Then, the controller 10 calculates, from the calculated decreasing slope, an estimated period of time within which the light emission amount of the LD unit decreases to 50% of the initial individual light emission amount, namely, an estimated lifetime of the LD unit. Consequently, the estimated lifetimes of the LD units A to C are acquired. FIG. 5 illustrates an example in which the estimated lifetime of the LD unit B is longer than that of the LD unit A because the decreasing slope of the light emission amount of the LD unit B is smaller than that of the LD unit A and in which the estimated lifetime of the LD unit C is shorter than that of the LD unit A because the decreasing slope of the light emission amount of the LD unit C is larger than that of the LD unit A.

Subsequently, at step S107, the controller 10 determines whether or not the estimated lifetimes of the LD units 21 to 23 are longer than a set lifetime as a target lifetime set for the light source unit 6. In this embodiment, the set lifetime (target lifetime) satisfies a lifetime condition required for the light source unit 6. For instance, the set lifetime is set to ten thousand hours where the light emission amount (luminance) decreases from that at the initial state to 50% thereof. When the LD units 21 to 23 include at least one first LD unit (first light source) whose estimated lifetime is shorter than the set lifetime, the controller 10 calculates an estimated lifetime of the light source unit 6 as a whole from the estimated lifetimes of the LD units 21 to 23. In the following description, the estimated lifetime of the light source unit 6 as a whole is referred to as "a total estimated lifetime". Then, the controller 10 determines whether or not the total estimated lifetime is shorter than the above-described set lifetime due to the short estimated lifetime of the first LD unit, that is, whether or not it is necessary to perform the lifetime control described later.

In FIG. 5, the estimated lifetimes of the LD units A and B each indicated by a dotted line are longer than the set lifetime, but the estimated lifetime of the LD unit C indicated by a dashed-dotted line is shorter than the set lifetime. In this case, the LD unit C corresponds to the first LD unit. The total estimated lifetime in this case is shorter than the set lifetime as indicated by TOTAL-B. The total estimated lifetime TOTAL-B is longer than the estimated lifetime of the LD unit C. This is because, even when the light emission amount of the LD unit C becomes less than 50% of the light emission amount in the initial state, the light emission amount of the light source unit 6 as a whole can be maintained to be greater than 50% of the light emission amount in the initial state by being compensated by the light emission amounts of the LD units A and B.

The controller 10 proceeds to step S108 if the estimated lifetime TOTAL-B is shorter than the set lifetime and proceeds to step S110 if not.

At step S108, in order to extend the lifetime (total estimated lifetime) of the light source unit 6 to at least the set lifetime, the controller 10 performs the lifetime control that decreases the light emission amount of the first LD unit (i.e., the LD unit C). That is, the controller 10 decreases the drive duty ratio of the LD unit C. The decrease of the light emission amount of the LD unit C decreases a load of the LD unit C. This decrease of the load extends the lifetime of the LD unit C, which consequently extends the lifetime of the light source unit 6.

Specifically, the controller 10 calculates, while sequentially virtually decreasing the drive duty ratio of the LD unit C, the estimated lifetime of the LD unit C driven at the decreased drive duty ratio and further calculates the total estimated lifetime based on the calculated estimated lifetime of the LD unit C. Then, the controller 10 acquires a drive duty ratio of the LD unit C that makes the total estimated lifetime TOTAL-A indicated by a dashed double-dotted line in FIG. 5 equal to or more than the set lifetime. FIG. 5 illustrates, as an example, a case where the drive duty ratio is acquired such that the estimated lifetime of the LD unit C ("LD UNIT C ADJUSTED LIGHT AMOUNT" in the drawing) indicated by a dashed line coincides with the set lifetime. On the other hand, FIG. 4 illustrates an example in which the drive duty ratio of the LD unit C is decreased from 80% to 50%. In this example, the drive duty ratios of the LD units A and B are not changed from 80%.

Next, at step S110, the controller 10 lights the LD unit C at the drive duty ratio of 50% calculated at step S108 and lights the LD units A and B at the drive duty ratio of 80% read at step S102. On the other hand, when proceeding from step S109 to step S110, the controller 10 lights the LD units A, B and C at the drive duty ratio of 80% read at step S109. Consequently, image projection using the light from the light source unit 6 is started.

This embodiment decreases, when the multiple light sources (LD units 21 to 23) in the light source unit 6 include the first light source whose estimated lifetime is short due to their individual differences, the light emission amount of the first light source to extend its lifetime such that the lifetime of the light source unit 6 satisfies the set lifetime. This control of the light emission amount of the first light source enables enhancing a reliability of the light source unit 6 used for the projector 100, in other words, enhancing a reliability of the projector 100.

This embodiment described the case of performing the lifetime estimation by using the light emission amount acquired in the initial state and the light emission amount acquired at the time when the predetermined period of time has elapsed from the initial state. However, the lifetime estimation may be performed, if the lifetime estimation is performed at each predetermined period of time, by using a light emission amount acquired after the initial state and a light emission amount acquired at a time when a predetermined period of time has elapsed therefrom. In this case, in the flowchart of FIG. 3, the initial individual light emission amount may be regarded as the light emission amount acquired after the initial state.

Furthermore, before the predetermined period of time elapses from the initial state, that is, before the lifetime estimation is performed, a user may select a dimming mode (power save mode) of the projector 100 or may use the projector 100 with a brightness thereof being adjusted. In such a case, the drive duty ratio of each LD unit is changed from the initial setting ratio of 80%. In this case, the controller 10 performs, at step S106, the lifetime estimation corresponding to the changed drive duty ratio and calculates, at step S108, a new drive duty ratio to which the changed drive duty ratio is further changed.

Embodiment 2

Next, description will be made of a second embodiment (Embodiment 2) of the present invention. Embodiment 1 decreases the light emission amount of the first LD unit whose estimated lifetime is shorter than the set lifetime of the light source unit 6 to reduce the load of the first LD unit, thereby extending the lifetimes of the first LD unit and the light source unit 6. However, decreasing the light amount of the first LD unit decreases a light emission amount of the light source unit 6 as a whole. For this reason, a projector of this embodiment suppresses a decrease in a light emission amount of a light source unit while extending a lifetime of the light source unit to a set lifetime.

Figure 3:
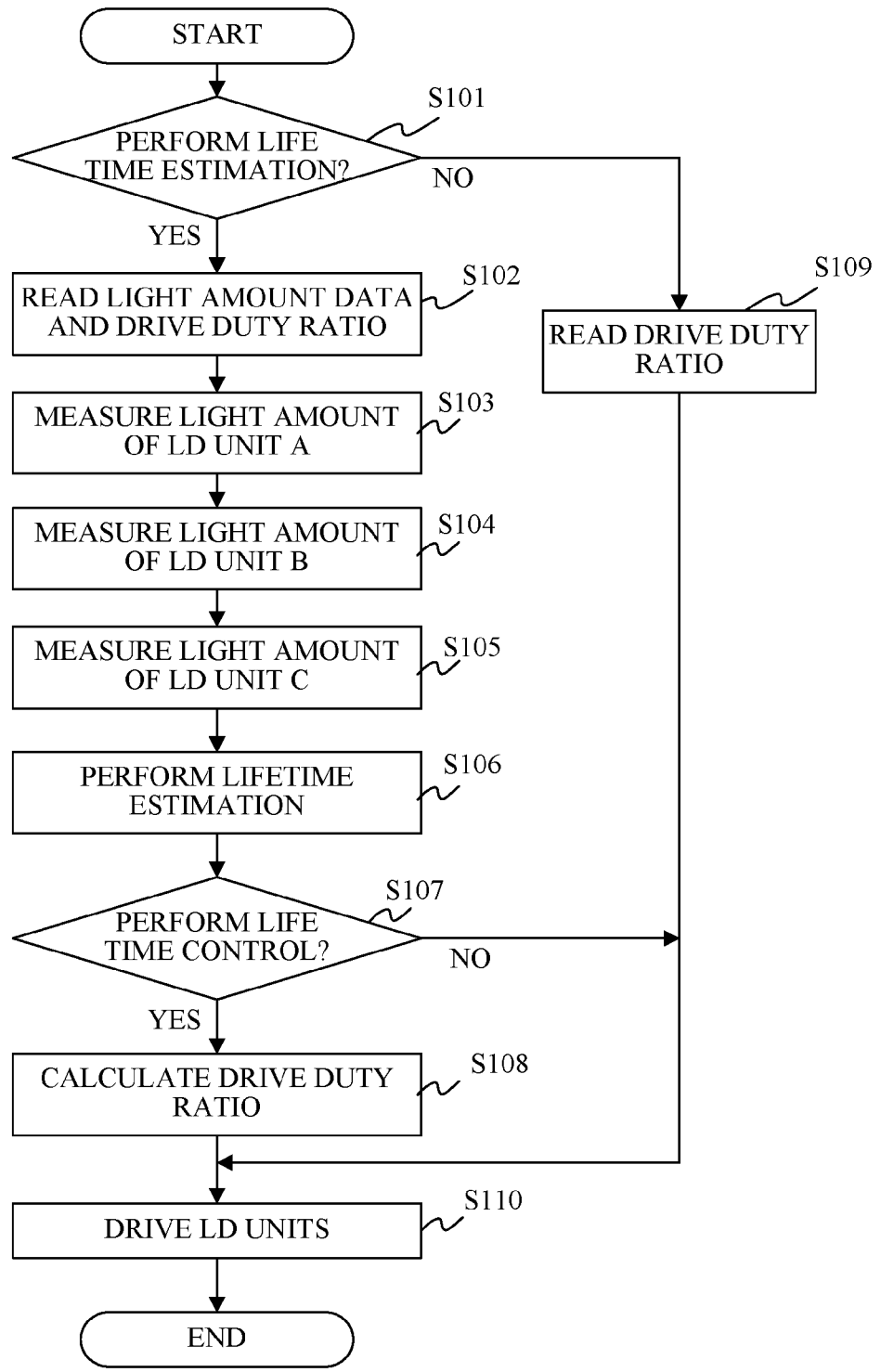
FIG. 3 is a flowchart illustrating a light source control process in the projector of Embodiment 1.

In Embodiment 2, a configuration of the projector, a configuration of the light source unit and a flowchart of a light source control process are the same as those illustrated in FIGS. 1, 2 and 3 used in Embodiment 1. However, a process performed at step S108 of the flowchart in this embodiment is different from that in Embodiment 1. In this embodiment, constituent elements identical to those in Embodiment 1 are denoted by the same reference numerals as those in Embodiment 1.

Figure 6:
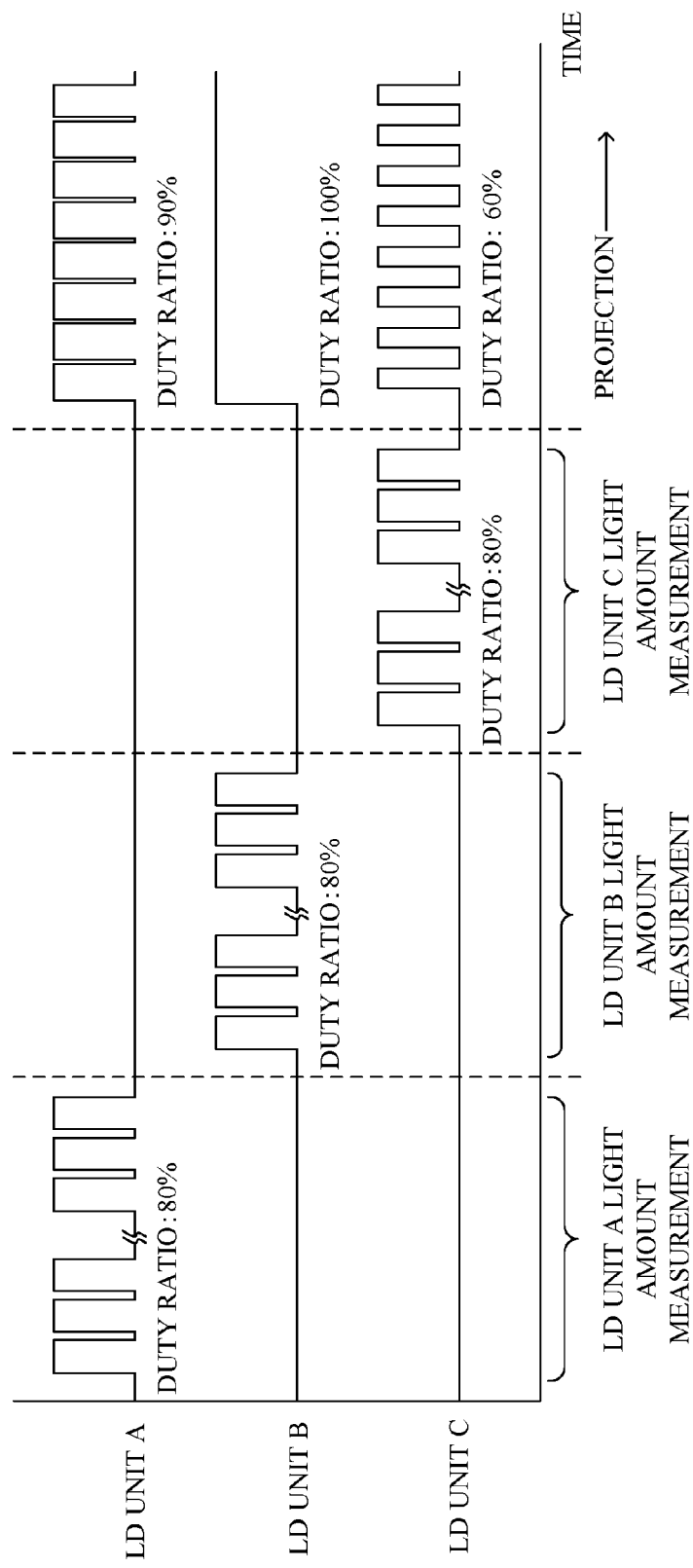
FIG. 6 illustrates an example of a light source control process in a projector that is Embodiment 2 of the present invention.

As illustrated in FIG. 6, processes in this embodiment are the same as those performed at steps S103 to S105 in Embodiment 1 in that the processes cause a light amount sensor 13 to measure current individual light emission amounts while sequentially driving an LD unit A (21), an LD unit B (22) and an LD unit C (23) in this order, that is, while sequentially lighting the LD units A, B and C, at a drive duty ratio of 80%.

Figure 7:
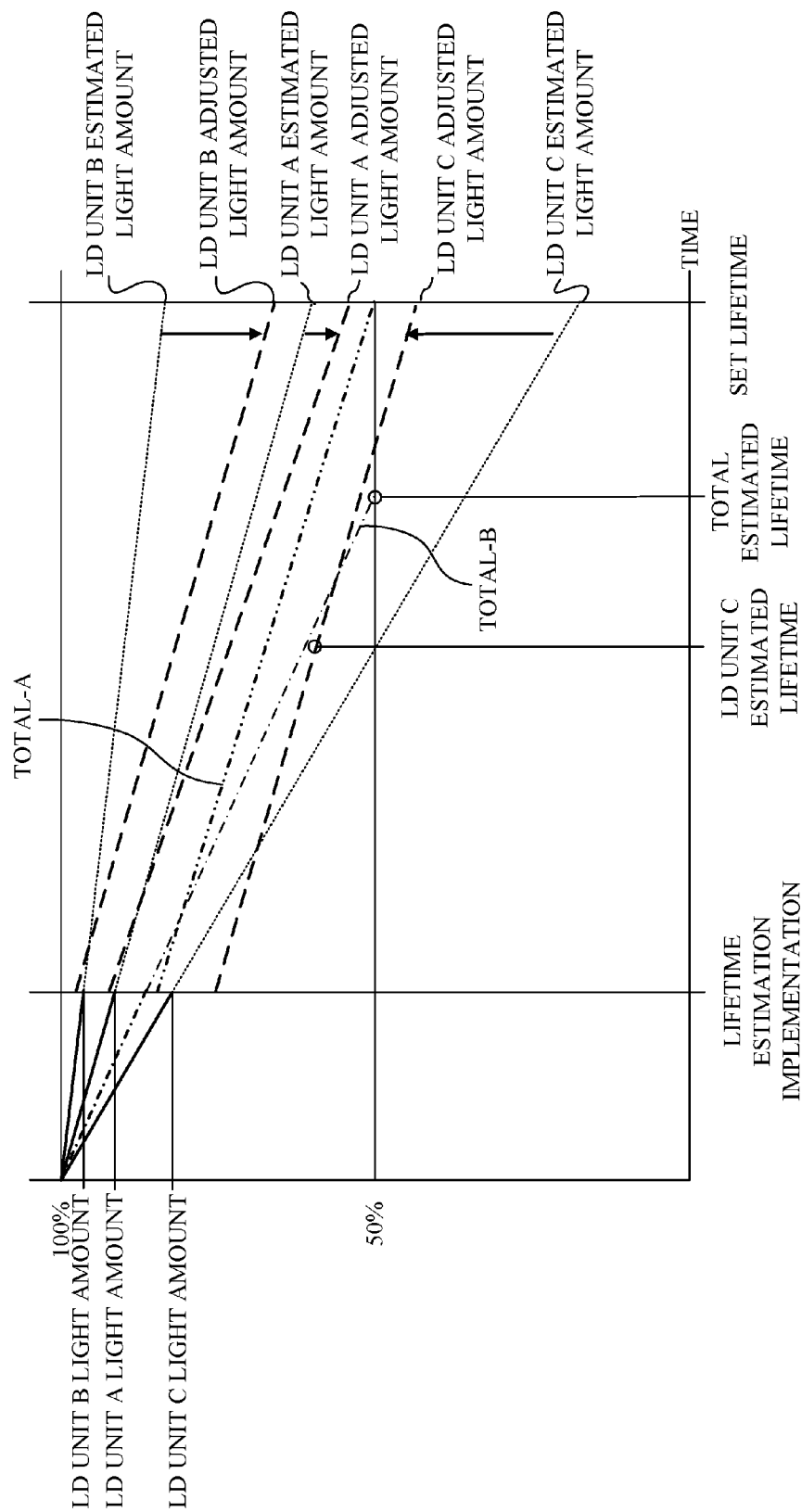
FIG. 7 illustrates lifetimes of a light source unit and individual light sources in the projector of Embodiment 2.

FIG. 7 illustrates an example of results of lifetime estimation of the respective LD units A to C performed at step S106 and lifetime control performed at step S108 in this embodiment. In FIG. 7, estimated lifetimes of the LD units A, B and C calculated by a controller 10 at step S106 and a total estimated lifetime TOTAL-B of the light source unit 6 are identical to those in FIG. 5.

In this embodiment, at step S108, the controller 10 decreases the light emission amount of the LD unit C that is the first LD unit so as to extend the lifetime (total estimated lifetime) of the light source unit 6 to at least the set lifetime.

That is, the controller 10 decreases the drive duty ratio of the LD unit C. This embodiment is the same as Embodiment 1 in this regard. As illustrated in FIG. 6, an amount of the decrease in the drive duty ratio of the LD unit C is less compared to that in Embodiment 1. In this embodiment, the drive duty ratio of the LD unit C is decreased from 80% to 60%.

Consequently, the estimated lifetime of the LD unit C extends to an intersection of a dashed line and a line indicating the light emission amount 50% both illustrated in FIG. 7, but not to the set lifetime. As just described, it is not necessary to decrease the drive duty ratio of the LD unit C so as to extend the estimated lifetime thereof to the set lifetime.

On the other hand, the controller 10 increases the drive duty ratio of the LD unit A and that of the LD unit B, each as a second LD unit (second light source) whose estimated lifetime is marginally longer than the set lifetime, from 80% to 90% and from 80% to 100%, respectively. This increase in the drive duty ratios increases the light emission amounts of the LD units A and B, which increases loads of the LD units A and B. This increase in the loads shortens the estimated lifetime of the LD units A and B. However, even after the drive duty ratios are increased, the estimated lifetimes of the LD units A and B are longer than the set lifetimes as indicated by dashed lines. The increase in the light emission amounts of the LD units A and B extends the total estimated lifetime TOTAL-A of the light source unit 6 to the set lifetime even though the estimated lifetime of the LD unit C does not extend to the set lifetime. Moreover, the decrease in the light emission amount of the LD unit C is compensated with the increase in the light emission amounts of the LD units A and B, which enables suppressing a variation in the light emission amount of the light source unit 6 as a whole.

This embodiment enables, as Embodiment 1, enhancing reliabilities of the light source unit 6 and the projector 100 and suppressing the variation in the light emission amount of the light source unit 6, namely, a brightness of a projected image even when the lifetimes of the multiple light sources are mutually different due to their individual differences.

Embodiment 3

Next, description will be made of a third embodiment (Embodiment 3) of the present invention. Although Embodiments 1 and 2 described the case where the set lifetime of the light source unit 6 is fixed, the set lifetime may be shorter than or should be longer than, for example, ten thousand hours described in Embodiment 1 depending on an intended use of the projector. This embodiment will describe an example in which the set lifetime is changeable.

In this embodiment, configurations of a projector and a light source unit are the same as those illustrated in FIGS. 1 and 2 in Embodiment 1. In this embodiment, constituent elements identical to those in Embodiment 1 are denoted by the same reference numerals as those in Embodiment 1.

Figure 8:
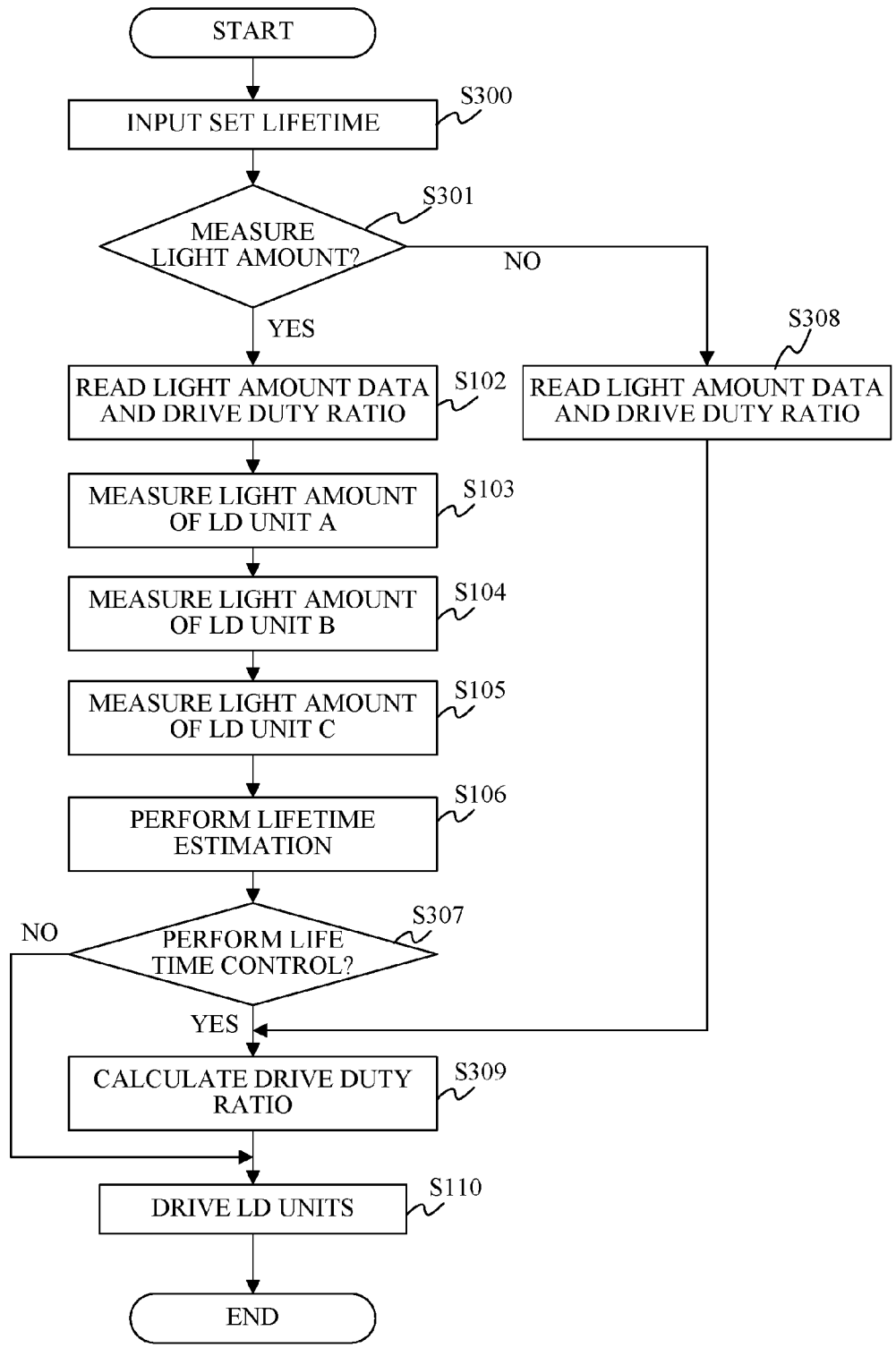
FIG. 8 is a flowchart illustrating a set life change process in a projector that is Embodiment 3 of the present invention.

A flowchart of FIG. 8 illustrates a light source control process in the projector of this embodiment. Also in this embodiment, a controller 10 executes this process according to a light source control program that is a computer program. In addition, in FIG. 8, steps identical to those in the flowchart shown in FIG. 3 are denoted by the same step numbers as those in FIG. 3.

The controller 10 sets at step S300, in response to an input operation of the set lifetime provided on an operation panel 11 as a changer or on a remote controller (not illustrated) by a user, the input set lifetime as a new set lifetime. For instance, the controller 10 changes the set lifetime from ten thousand hours initially set to seven thousand hours newly input. Although this embodiment will describe a case of shortening the set lifetime, the set lifetime may otherwise be prolonged.

Next, at step S301, the controller 10 checks whether or not it is necessary to measure light emission amounts of LD units 21 to 23 included in the light source unit 6. For instance, when a lifetime estimation previously performed shows that a cumulative lighting time is short, the measurement of the light emission amounts of the LD units 21 to 23 may be omitted. When the measurement of the light emission amounts is to be performed, the controller 10 reads initial individual light emission amounts and drive duty ratios of the LD units 21 to 23 at step S102, measures the light emission amounts of the LD units 21 to 23 at steps S103 to S105 and then calculates estimated lifetimes of the LD units 21 to 23 at step S106.

Then, at step S307, the controller 10 determines whether or not the estimated lifetimes of the LD units 21 to 23 are longer than the set lifetime input (set) at step S300. As in Embodiment 1, when the LD units 21 to 23 include at least one first LD unit whose estimated lifetime is shorter than the set lifetime, the controller 10 calculates a total estimated lifetime of the light source unit 6 from the estimated lifetimes of the LD units 21 to 23. Thereafter, the controller 10 determines whether or not the total estimated lifetime is shorter than the set lifetime due to the short estimated lifetime of the first LD unit, that is, whether or not it is necessary to perform lifetime control. The controller 10 proceeds to step S309 if the total estimated lifetime is shorter than the set lifetime and proceeds to step S110 if not.

At step S309, the controller 10 performs the lifetime control that decreases the light emission amount of the first LD unit so as to extend the lifetime (total estimated lifetime) of the light source unit 6 to at least the set lifetime. In this lifetime control, as described in Embodiment 2, the controller 10 may increase the light emission amount of the second LD unit.

On the other hand, if determining, at step S301, that it is not necessary to measure the light emission amounts of the LD units 21 to 23, the controller 10 reads, at step S308, data on the light emission amounts previously measured and data on the estimated lifetime calculated in that measurement and others. Then, the controller 10 proceeds to step S309 and calculates the drive duty ratios of the LD units 21 to 23 from the estimated lifetimes of the LD units 21 to 23 read at step S308. Thereafter, the controller 10 proceeds to step S110.

At step S110, the controller 10 lights the LD units 21 to 23 at the drive duty ratios calculated at step S309.

Even when the drive duty ratio of the LD unit that was the first LD unit in the previous lifetime control is decreased, a recalculated estimated lifetime of the LD unit may be longer than the newly set lifetime. In this case, the drive duty ratio of that LD unit may be again increased to increase its light amount.

As described above, this embodiment enables performing the lifetime control of the LD units depending on the change of the set lifetime of the light source unit 6 corresponding to the intended use of the projector.

Although each of the above embodiments described the case of performing the lifetime estimation by using the result of the measurement of the light emission amount of each LD unit performed by using the light amount sensor, the temporal information relating to the temporal change of each LD unit includes, in addition to the light emission amount, a drive current value or a drive voltage value of each LD unit and a temperature or an ambient temperature of the LD unit. For this reason, the lifetime estimation of the LD unit may be performed depending on a change in the drive current value, the drive voltage value or the temperature.

Moreover, although each of the above embodiments described the case where the increase and decrease in the light emission amount of each light source are performed by changing the drive duty ratio in the intermittent drive, the light emission amount may be increased and decreased by changing the drive current value at which the light source is to be lit.

As described above, each of the above embodiments enables, even when the lifetimes of the individual light sources included in the light source unit vary, reducing an influence of the variation to allow the light source unit to satisfy the target lifetime. Moreover, use of the light source control apparatus enables enhancing the reliability of the projector (image projection apparatus) provided with the light source unit including the multiple light sources.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-248571, filed on Dec. 9, 2014, which is hereby incorporated by reference herein in its entirety.

What is claimed is:

1. A light source control apparatus configured to control driving of multiple light sources included in a light source unit that is used in a state where the multiple light sources are lit, the multiple light sources each including multiple light-emitting elements, the light source control apparatus comprising:
   a memory storing instructions; and
   a processor configured to implement the instructions stored in the memory and execute:
      a measuring task that measures a measurable amount of each of the light sources, the measurable amount relating to a temporal change of each of the light sources;
      a calculating task that calculates a lifetime of each of the multiple light sources using the measurable amount; and
      a control task that decreases, when the multiple light sources include a first light source whose calculated lifetime is shorter than a target lifetime set for the light source unit, a light emission amount of the first light source.

2. The light source control apparatus according to claim 1, wherein, when a lifetime of the light source unit is calculated to be shorter than the target lifetime because the first light source is included in the multiple light sources, the control task decreases the light emission amount of the first light source to extend the lifetime of the light source unit to at least the target lifetime.

3. The light source control apparatus according to claim 1, wherein the control task decreases the light emission amount of the first light source and to increase a light emission amount of a second light source that is included in the multiple light sources and whose calculated lifetime is longer than the target lifetime.

4. The light source control apparatus according to claim 1, wherein the measuring task measures the measurable amount of the light source being lit, while sequentially changing one of the multiple light sources that is to be lit.

5. The light source control apparatus according to claim 1, wherein the measurable amount is a light emission amount of each of the light sources.

6. The light source control apparatus according to claim 1, wherein the measurable amount is a drive current value or a drive voltage value of each of the light sources.

7. The light source control apparatus according to claim 1, wherein the measurable amount is a temperature or an ambient temperature of each of the light sources.

8. The light source control apparatus according to claim 1, the processor further executes a changing task that changes the target lifetime.

9. The light source control apparatus according to claim 1, wherein the multiple light-emitting elements are connected in series to one another.

10. An image projection apparatus comprising:
   a light source control apparatus; and
   an optical unit configured to project an image formed by modulating, depending on an input image signal, light from a light source unit including multiple light sources whose light emissions are controlled by the light source control apparatus,
   wherein the light source control apparatus is configured to control driving of the multiple light sources that is used in a state where the multiple light sources are lit, the multiple light sources each including multiple light-emitting elements, and comprises:
   a memory storing instructions; and
   a processor configured to implement the instructions stored in the memory and execute:

a measuring task that measures a measurable amount of each of the light sources, the measurable amount relating to a temporal change of each of the light sources;

a calculating task that calculates a lifetime of each of the multiple light sources using the measurable amount; and a control task that decreases, when the multiple light sources include a first light source whose calculated lifetime is shorter than a target lifetime set for the light source unit, a light emission amount of the first light source.

11. A non-transitory computer-readable storage medium storing a computer program executable by a computer to execute a method of controlling driving of multiple light sources included in a light source unit that is used in a state where the multiple light sources are lit, the multiple light sources each including multiple light-emitting elements, the method comprising the steps of:

measuring a measurable amount of each of the light sources relating to a temporal change of each of the light sources;

calculating a lifetime of each of the multiple light sources using the measured measurable amount; and decreasing, when the multiple light sources include a first light source whose calculated lifetime is shorter than a target lifetime set for the light source unit, a light emission amount of the first light source.

* * * * *